(12) United States Patent
Jones et al.

(10) Patent No.: US 11,178,800 B2
(45) Date of Patent: **\*Nov. 16, 2021**

(54) CERAMIC OVERVOLTAGE PROTECTION DEVICE HAVING LOW CAPACITANCE AND IMPROVED DURABILITY

(71) Applicant: KEMET Electronics Corporation, Fort Lauderdale, FL (US)

(72) Inventors: Lonnie G. Jones, Simpsonville, SC (US); Iain D. Kinnon, Simpsonville, SC (US); John Bultitude, Simpsonville, SC (US); Nathan A. Reed, Simpsonville, SC (US); Jeffrey W. Bell, Simpsonville, SC (US); George Michael Theis, Simpsonville, SC (US)

(73) Assignee: KEMET Electronics Corporation, Fort Lauderdale, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/517,066

(22) Filed: Jul. 19, 2019

(65) Prior Publication Data

US 2020/0163260 A1     May 21, 2020

Related U.S. Application Data

(63) Continuation-in-part of application No. 16/195,159, filed on Nov. 19, 2018.

(51) Int. Cl.
*H05K 9/00*          (2006.01)
*H01G 2/14*          (2006.01)
(Continued)

(52) U.S. Cl.
CPC ............. *H05K 9/0067* (2013.01); *H01C 1/14* (2013.01); *H01C 7/12* (2013.01); *H01G 2/14* (2013.01); *H01G 4/005* (2013.01)

(58) Field of Classification Search
CPC . H05F 3/04; H01G 4/005; H01G 4/30; H01G 4/40; H01G 2/14; H01C 7/12; H01C 1/14; H05K 9/0067
(Continued)

(56) References Cited

U.S. PATENT DOCUMENTS

| 5,807,509 A | 9/1998 | Shrier et al. |
| 6,251,513 B1 | 6/2001 | Rector et al. |

(Continued)

FOREIGN PATENT DOCUMENTS

EP     2 337 171 A1    6/2011

OTHER PUBLICATIONS

ISA/US; International Search Report and Written Opinion prepared for PCT/US19/56984; Applicant: KEMET Electronics Corporation; dated Feb. 27, 2020.

*Primary Examiner* — Arun Ramaswamy
(74) *Attorney, Agent, or Firm* — Joseph T. Guy; Patent Filing Specialist Inc.

(57) ABSTRACT

Provided is an improved overvoltage protection element. The overvoltage protection device comprises at least one ESD protection couple comprising discharge electrodes in a plane, a gap insulator between the discharge electrodes, an overvoltage protection element parallel to the planar discharge electrodes wherein the overvoltage protection element comprises a conductor and an secondary material. The overvoltage protection element also comprises a primary insulator layer between the discharge electrodes and overvoltage protection element.

29 Claims, 7 Drawing Sheets

(51) Int. Cl.
*H01G 4/005* (2006.01)
*H01C 7/12* (2006.01)
*H01C 1/14* (2006.01)

(58) Field of Classification Search
USPC .... 361/301.4, 321.1, 321.2, 272, 321.3, 303
See application file for complete search history.

(56) References Cited

U.S. PATENT DOCUMENTS

| | | |
|---|---|---|
| 9,001,485 B2 | 4/2015 | Nozoe et al. |
| 2007/0216015 A1 | 9/2007 | Schnitt et al. |
| 2009/0067113 A1* | 3/2009 | Urakawa .................. H01T 4/12 |
| | | 361/220 |
| 2011/0002075 A1 | 1/2011 | Asakawa et al. |
| 2011/0026186 A1 | 2/2011 | Katsumura et al. |
| 2011/0032649 A1 | 2/2011 | Lee et al. |
| 2011/0227196 A1 | 9/2011 | Adachi et al. |
| 2014/0232485 A1 | 8/2014 | Bultitude et al. |
| 2016/0028227 A1* | 1/2016 | Suzuki ...................... H01T 1/22 |
| | | 361/56 |
| 2017/0316879 A1 | 11/2017 | Kim et al. |
| 2018/0098410 A1 | 4/2018 | Adachi et al. |
| 2018/0124904 A1* | 5/2018 | Cho ......................... H01G 4/40 |
| 2018/0139827 A1 | 5/2018 | Cho et al. |

\* cited by examiner

CERAMIC OVERVOLTAGE PROTECTION DEVICE HAVING LOW CAPACITANCE AND IMPROVED DURABILITY

CROSS-REFERENCE TO RELATED APPLICATIONS

The present invention is a continuation-in-part of pending U.S. patent application Ser. No. 16/195,159 filed Nov. 19, 2018 which is incorporated herein by reference.

BACKGROUND

The present invention is related to a ceramic overvoltage protection device which provides improved control over the trigger voltage, has reduced leakage current and which does not break down with repeated overvoltage pulses.

There is an ongoing need in modern electronics for increased protection of semiconductors, integrated circuits and other components from Electro-Static Discharge (ESD) and fast electronic transients. ESD can reach over 30 kV which is well beyond that which a core processor is capable of withstanding. ESD is a primary cause for the failure of integrated circuits and this is a particular problem with respect to miniaturization of electronics wherein suitable protection has proven difficult to provide reliably.

The necessity for ESD protection has increased that portion of the available space in a device devoted to ESD protection. This utilization of space, for other than device functionality, is contrary to the constant desire for miniaturization of components and devices. In addition to the space consumption of on-chip ESD protection devices they also inhibit the speed and quantity of data that can be processed. Therefore, there is a desire for off-chip protection and, particularly, discrete components which can provide ESD protection, without loss of processing speed, and which do not consume valuable space within the circuit design or in the device.

Multilayer Ceramic Capacitor (MLCC) devices have an established role in ESD protection. The higher capacitance levels of an MLCC absorb charge from an ESD or transient event. Unfortunately, high capacitance compromises signal integrity in high speed data applications. If the capacitance of the MLCC is reduced its ability to absorb the ESD or transient event is lowered because the charge absorbed, Q is dependent on the capacitance C, and voltage V by the relationship Q=CV. It can therefore be seen that if capacitance is lowered by 50% the voltage that the capacitor has to withstand has to increase by 50% to maintain the same capability to absorb the coulombic charge, Q. In practice it is not possible to increase the voltage withstanding capability of low capacitance MLCC to this extent so their capability is reduced. Furthermore, when protective devices such as varistors are employed the leakage current to ground, while the device is inactive, can be a major drain on the standby life of battery powered devices. Any parasitic drain on a battery is undesirable and therefore protection devices with high leakage and high capacitance are less desirable.

To meet the demands of modern circuitry an ideal ESD protection device would preferably have a low capacitance with negligible leakage current to ground in its inactive state. When exposed to elevated voltage or current, due to an ESD event, the ESD protection device should respond rapidly, such as <1 ns, to divert potentially harmful transient energy to ground via a low resistance path. After the ESD event has subsided the ESD protection device should revert to its previous inactive state. Furthermore, the ESD protection device should be able to withstand multiple ESD or transient events while returning to near the pre-event capacitance and near pre-event leakage current characteristics of its initial inactive mode. Meeting all of these criteria, particularly with high voltage applications, has proven to be difficult as evidenced by the lack of suitable ESD protection devices available to designers of modern circuitry.

Provided herein is an improved ESD protection device which meets the advanced demands of modern circuitry.

SUMMARY OF THE INVENTION

The invention is related to an improved overvoltage protection device and a method for forming the improved overvoltage protection device.

It is an object of the invention to provide an overvoltage protection device with low capacitance, low leakage current and the ability to withstand many ESD pulses.

A particular feature of the invention is the ability to manufacture the overvoltage protection device using standard manufacturing techniques used for the manufacture of MLCC capacitors.

Another feature of this invention is to allow high ESD protection to be combined with a low capacitance multilayer ceramic capacitor such that the combined device can protect from high transient voltages whilst retaining capacitance for signal filtering while occupying only a minimum amount of available space.

These and other embodiments, as will be realized, are provided in an overvoltage protection device. The overvoltage protection device comprises at least one ESD protection couple comprising discharge electrodes in a plane, a gap insulator between the discharge electrodes, an overvoltage protection element parallel to the planar discharge electrodes wherein the overvoltage protection element comprises a conductor and a secondary material. The overvoltage protection element also comprises a primary insulator layer between the discharge electrodes and overvoltage protection element.

Yet another embodiment is provided in a method for forming an overvoltage protection device. The method comprises the steps:

forming at least one first layer comprising a secondary insulator precursor and an overvoltage protection element precursor on a primary insulator precursor;

forming at least one second layer on an internal insulator precursor comprising a pair of discharge electrodes and a gap insulator precursor between the discharge electrodes;

forming a stack comprising at least one first layer on at least one second layer in registration with the overvoltage protection element precursor overlaying the gap insulator precursor; and heating the stack to form a laminated stack comprising:
discharge electrodes in a plane;
a gap insulator between the discharge electrodes in the plane;
an overvoltage protection element parallel to the discharge electrodes; and
a primary insulator layer between the discharge electrodes and overvoltage protection element.

Yet another embodiment is provided in a dual-function overvoltage protection device. The overvoltage protection device comprises at least one ESD protection couple comprising discharge electrodes in a plane, a gap insulator between discharge electrodes, an overvoltage protection element parallel to the discharge electrodes and a primary insulator layer between the discharge electrodes and overvoltage protection element. The dual-function overvoltage protection device further comprises a capacitive couple.

DESCRIPTION

The instant invention is related to an improved ESD protection device which has a low capacitance and low leakage current in the inactive state, has a rapid response time in the presence of ESD events, and which can withstand many ESD events without compromise of capacitance, leakage current or functionality. More specifically, the present invention is related to a layered structure comprising a discrete insulator layer as a laminate between discharge electrodes and an overvoltage protection element. The structure provides for optimization of the trigger voltage which is the threshold voltage at which transient energy is diverted to electrical ground. The instant invention is also related to an ESD protection device which also comprises a capacitive couple suitable for signal filtering below the threshold voltage wherein above the threshold voltage the transient energy is diverted to electrical ground.

During normal operation the ESD protection couple of the ESD protection device is passive, or does not provide any functionality to the circuit, so by design the ESD protection couple is expected to exhibit low capacitance so that high speed signal distortion can be minimized. However, during an ESD event the ESD protection couple effectively acts as a switch allowing excess voltage to be dispersed to electrical ground.

The invention will be described with reference to the figures forming an integral, non-limiting, component of the disclosure. Throughout the description similar elements will be numbered accordingly.

Figure 1:
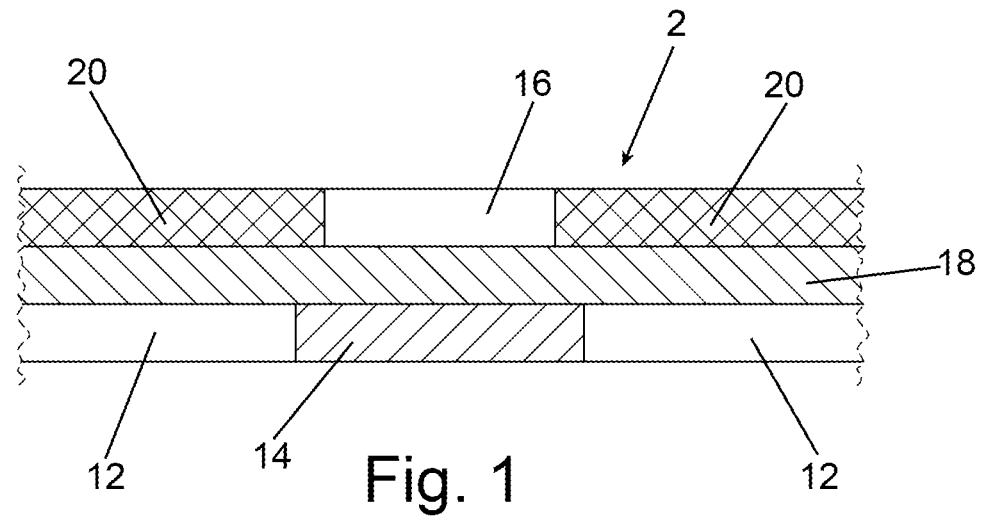
FIG. 1 is a cross-sectional schematic view of an embodiment of the invention.

An embodiment of the invention will be described with reference to FIG. 1 wherein an ESD protection couple, 2, is illustrated in cross-sectional schematic view. In FIG. 1, discharge electrodes, 12, which are preferably coplanar, are separated in the plane by a gap insulator, 14. A primary insulator layer, 18, extends in a planar manner over the discharge electrodes forming a laminate structure. An overvoltage protection element, 16, is separated from each discharge electrode by the primary insulator layer, 18. A secondary insulator, 20, preferably surrounds the overvoltage protection element within the layer comprising the overvoltage protection element. In a preferred, but non-limiting embodiment, the gap insulator, primary insulator layer and secondary insulator are the same material for manufacturing convenience. The ESD protection couple functions by conducting the pulse energy between the discharge electrodes, via the overvoltage protection element, during the transient event wherein the pulse energy passes through the primary insulator layer at each transit between the overvoltage protection element and discharge electrode. In a particularly preferred embodiment the width of the overvoltage protection element, 16, is no more than the width of the gap insulator, 14, thereby minimizing the overlap of the overvoltage protection element and the discharge electrodes, 12.

Figure 2:
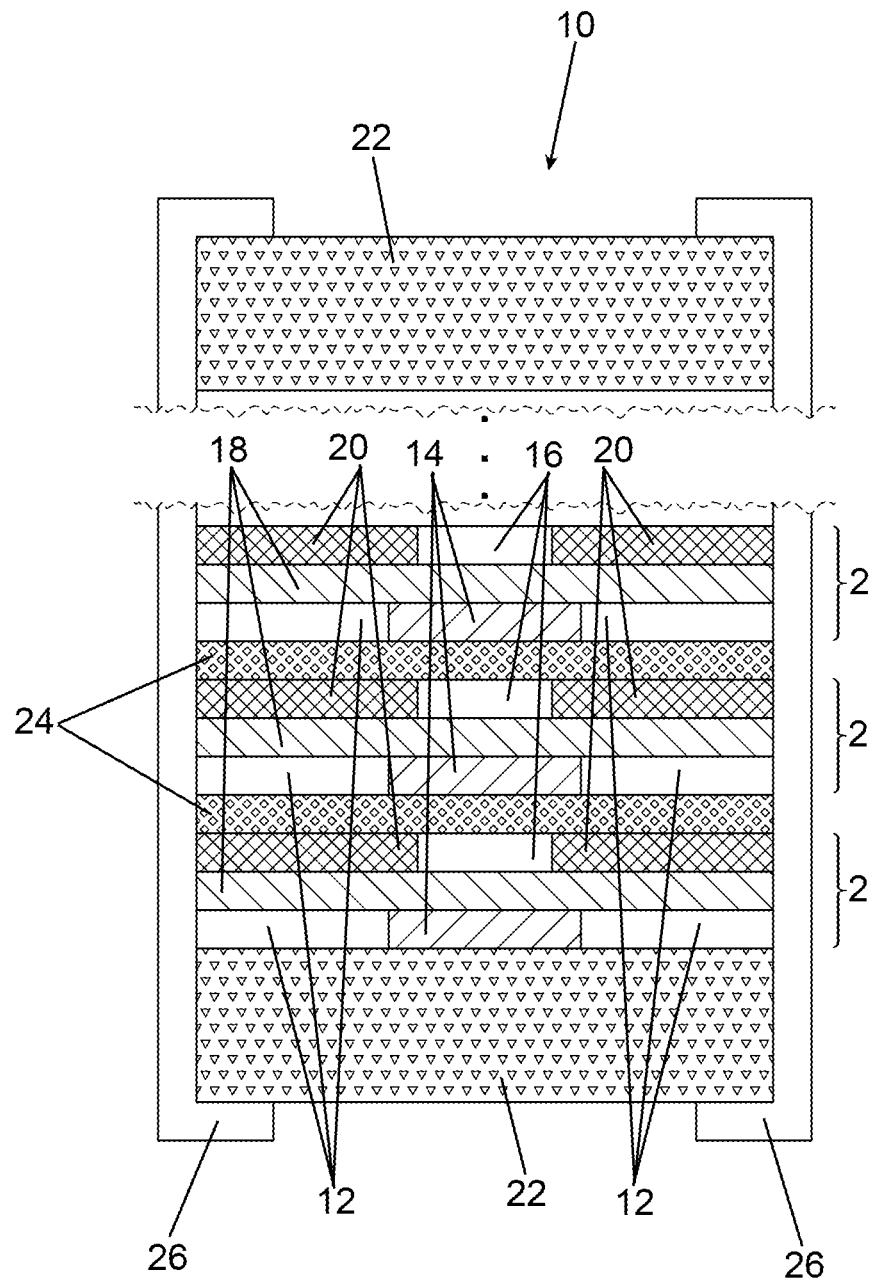
FIG. 2 is a cross-sectional schematic view of an embodiment of the invention.

An embodiment of the invention is illustrated in cross-sectional schematic view in FIG. 2. In FIG. 2, the ESD protection device, 10, comprises multiple ESD protection couples, 2, in a layered or laminate arrangement. An optional but preferred internal insulator, 24, may be between adjacent ESD protection couples. An external insulator, 22, is external to all ESD protection couples. The external insulator and internal insulator are preferably the same material for manufacturing convenience without limit thereto. External terminations, 26, in electrical contact with the discharge electrodes, 12, allow the ESD protection device to be electrically connected to a circuit as would be realized by those of skill in the art.

In a further embodiment of this invention the aforementioned ESD protection device may be combined with a capacitive couple to form a dual-function ESD protection device. The capacitive couple may consist of at least 2 overlapping electrodes of opposite polarity or the capacitive couple may employ a floating electrode. When a capacitive couple is incorporated it is desirable to minimize the overlap area between the discharge electrode and overvoltage protection element to reduce the stray capacitance thereby maintaining a low capacitance for the combined component. For convenience of manufacture the primary insulator and dielectric of the capacitor element is the same material. In this case it is essential that the thickness of the dielectric separating the electrodes of the capacitor exceeds the primary insulator thickness.

Figure 3:
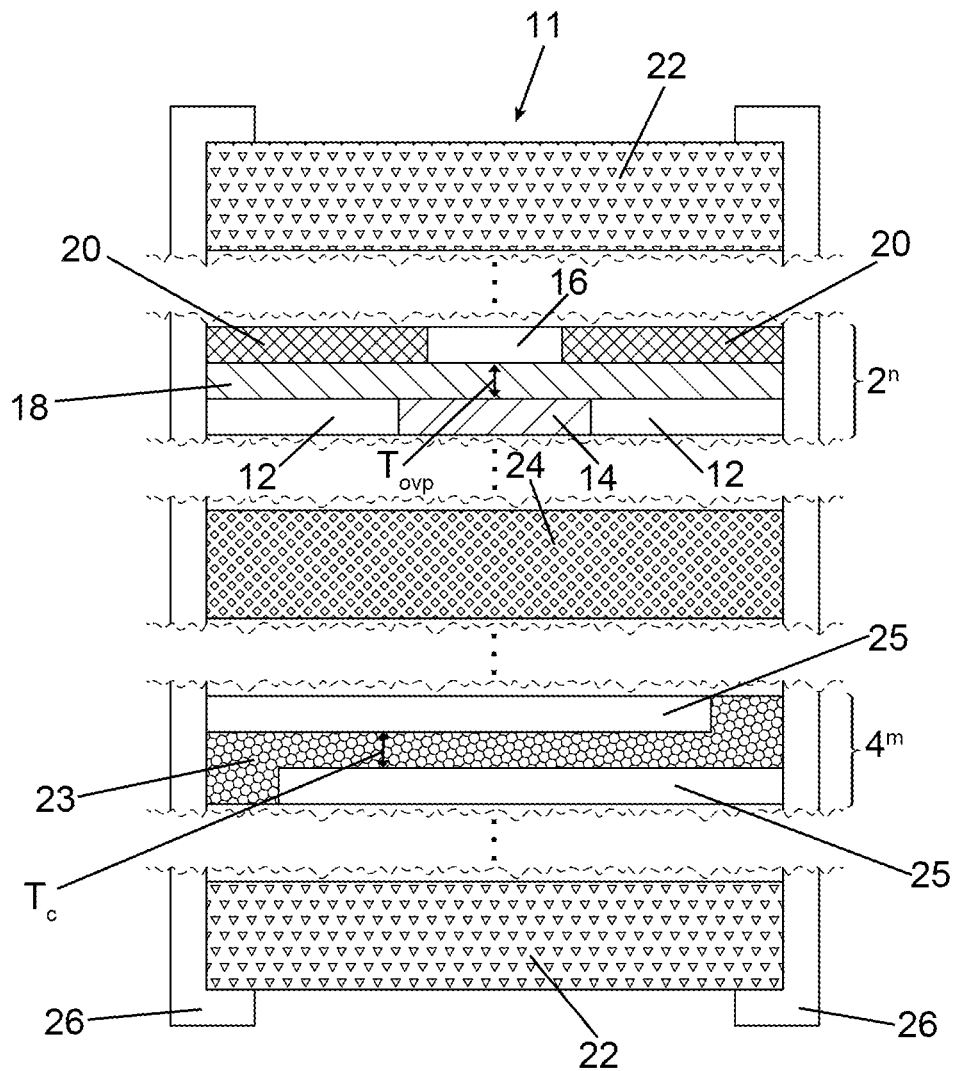
FIG. 3 is a cross-sectional schematic expanded view of an embodiment of the invention.

An embodiment of the invention is illustrated in cross-sectional expanded view in FIG. 3. In FIG. 3, a dual-function ESD device, 11, is illustrated. The dual-function ESD device comprises up to n ESD protection couples, 2, wherein n is the number of ESD protection couples in the device. At least m capacitive couples, 4, are illustrated wherein m is the number of capacitive couples in the dual-function ESD device. The capacitive couples comprise parallel internal electrodes, 25, of alternating polarity wherein adjacent internal electrodes terminate at different external terminations, 26, and adjacent internal electrodes are separated by a capacitor ceramic, 23. The internal insulator, 24, may be between adjacent ESD protection couples, 2, which is preferred. It is preferable that capacitor ceramic, 23, is in alternating layers between adjacent internal electrodes, 25, such that each set of adjacent internal electrodes forms a capacitive couple and therefore the number of capacitive couples functions as a single capacitor. The capacitor ceramic, 23, external insulator, 22, internal insulator, 24, gap insulator, 14, and primary insulator layer, 18, are preferable the same material for manufacturing convenience. When the primary insulator layer and capacitor ceramic are the same composition it is preferable that the separation of the overvoltage protection element, 16, from the discharge electrodes, 12, represented as $T_{OVP}$, is less than the separation distance between adjacent internal electrodes, 25, represented as $T_C$. A smaller separation distance in the ESD protection couples, 2, than in the capacitive couples, 4, prevents permanent electrical breakdown of the capacitive couple upon exposure to an ESD event. More preferably, $T_C$ is over two times larger than $T_{OVP}$.

Figure 4:
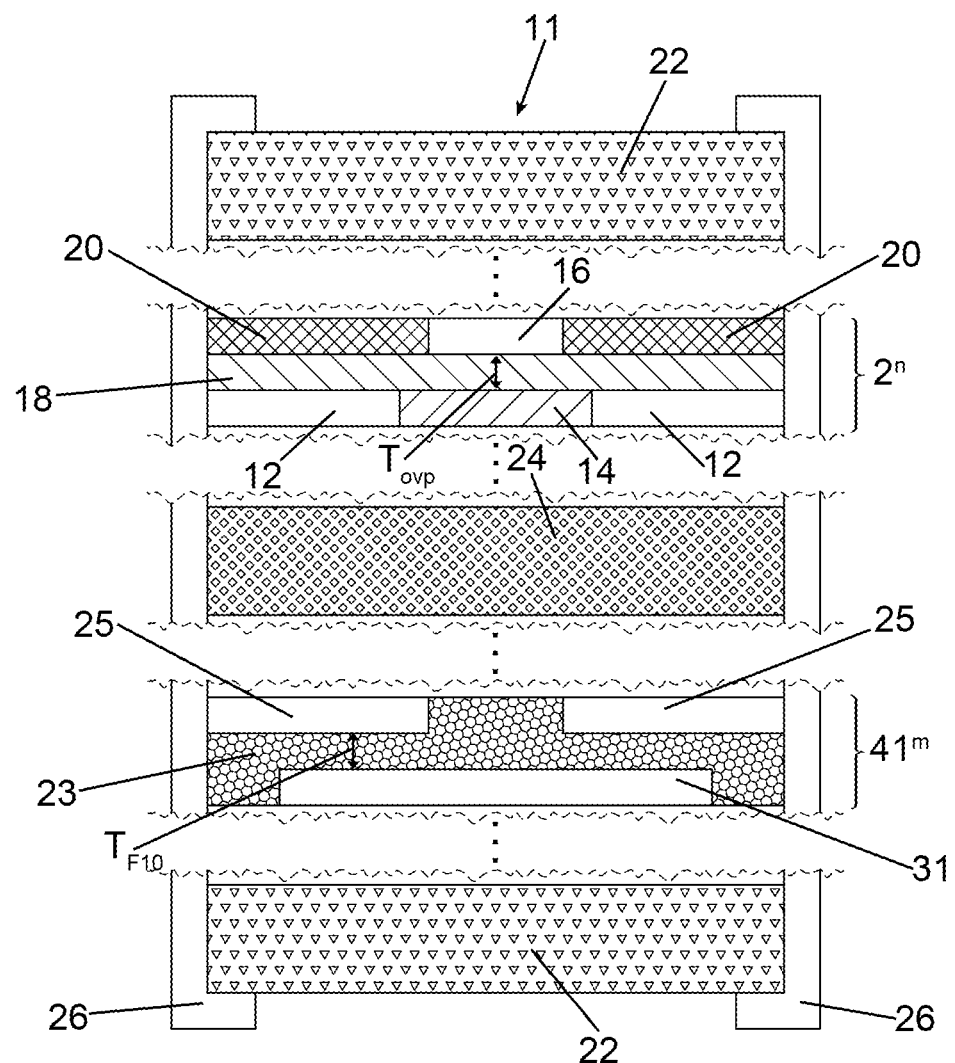
FIG. 4 is a cross-sectional schematic expanded view of an embodiment of the invention.

An embodiment of the invention is illustrated in cross-sectional expanded view in FIG. 4. In FIG. 4, a dual-function ESD device, 11, is illustrated which is similar to the device illustrated in, and described relative to, FIG. 3. In FIG. 4 the dual-function ESD device comprises m floating electrode capacitive couples, 41. The floating electrode capacitive couple comprises coplanar internal electrodes, 25, of opposite polarity with each terminating to an opposite external termination, 26. A floating electrode, 31, is parallel to the coplanar internal electrodes and separated from the plane of the coplanar internal electrodes by capacitor ceramic, 23. When the primary insulator layer and capacitor ceramic are the same composition it is preferable that the separation of the overvoltage protection element, 16, from the discharge electrodes, 12, represented as $T_{OVP}$, is less than the separation distance between the plane of the coplanar internal electrodes, 25, and the floating electrode represented as $T_{FLO}$. A smaller separation distance in the ESD couples, 2, than in the capacitive couples, 41, promotes temporary electrical breakdown of the ESD couples in preference to permanent electrical breakdown of the capacitive couples.

It is preferred that the capacitance of the ESD protection device is at least 0.1 to no more than 23,000 pF. When the ESD protection devices further comprises at least one capacitive couple it is preferable that the ESD protection device have a capacitance of at least 100 pF and more preferably at least 1000 pF. When the ESD protection device does not comprise a separate capacitive couple it is preferable that the capacitance of the ESD protection device be no more than 100 pF, preferably no more than 10 pF and even more preferably no more than 2 pF.

Figure 5:
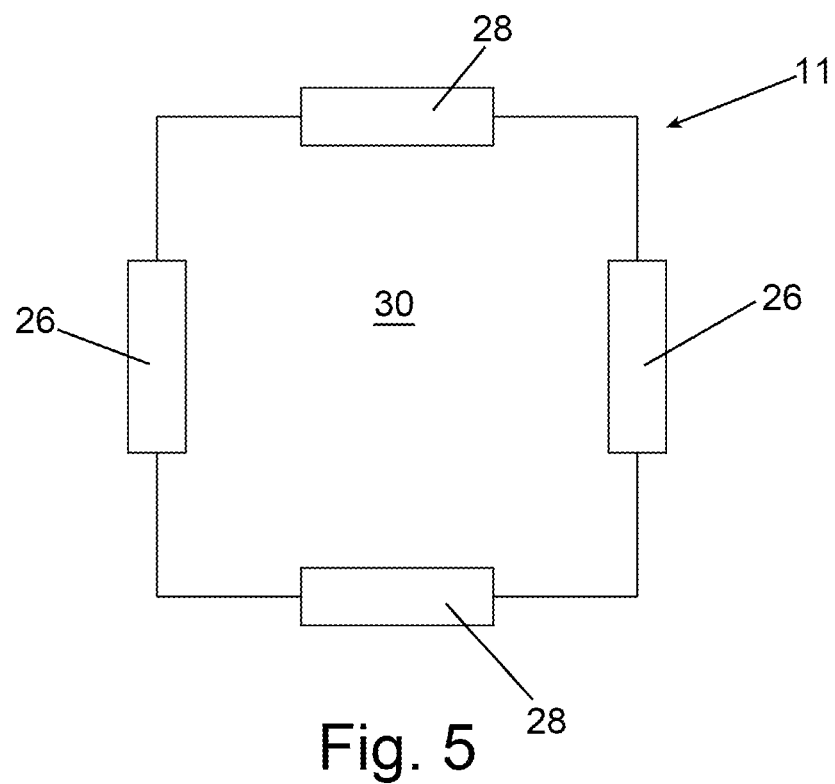
FIG. 5 is a top schematic view of an embodiment of the invention.

The ESD protection device may be a 2-terminal device wherein a separate external terminal is in electrical contact with adjacent co-planar discharge electrodes, as illustrated in FIG. 2. Alternatively, the overvoltage protection elements may terminate and be in electrical contact with secondary external terminations collectively, or independently, to form multi-terminal devices such as a 4-terminal device, as illustrated, without limit thereto, in FIG. 5. In FIG. 5, secondary external terminations, 28, may be in electrical contact with the same ESD protection couple, separate ESD protection couples, or a capacitive couple as described relative to FIGS. 3 and 4.

The number of ESD protection couples in an ESD protection device is not particularly limited. At least one ESD protection couple is necessary for functionality with many hundreds being within the scope of the invention. Above about 20 ESD protection couples the benefit is insufficient to justify the cost and manufacturing complexities associated with the large number of layers. Below about 3 ESD protection couples provides insufficient redundancy. It is preferable to have about 3 to about 10 ESD protection couples which is a balance between manufacturing efficiencies, cost, accumulated device capacitance and effectiveness.

The number of capacitive couples in a dual function ESD protection device is not particularly limited. At least one capacitive couple is necessary for functionality with many hundreds being within the scope of the invention. When the number of capacitive couples exceeds about 100 the benefit is insufficient to justify the cost and manufacturing complexities associated with the large number of layers. Below about 3 capacitive couples provides insufficient capacitance in the space allotted. It is preferable to have about 10 to about 20 capacitive couples which is a balance between manufacturing efficiencies, cost and effectiveness, although the capacitance can be tailored for specific application requirements.

Incorporation of an insulating material as the primary insulator layer, which is preferably an insulating dielectric material, between the discharge electrodes and overvoltage protection element provides an ESD protection device capable of maintaining a low effective capacitance for minimal signal distortion and low leakage to electrical ground in the passive mode. The primary insulating material is preferably sufficiently insulating to minimize leakage current. It is particularly preferred that leakage current of the ESD protection couple is no more than 5000 nA, more preferably no more than 2000 nA even more preferably no more than 1000 nA, even more preferably no more than 50 nA, even more preferably no more than 5 nA and most preferably no more than 1 nA. Furthermore, the primary insulator layer is preferably capable of withstanding the operating voltage without degradation thereby allowing the ESD protection component to return to a passive mode, after the transient event has subsided, without degradation. The lack of degradation, particularly in the primary insulator layer, improves capacitance stability and leakage current stability even after many ESD events.

Using conventional MLCC manufacturing techniques an ESD protection device can be manufactured by depositing layers of discharge electrode and overvoltage protection element precursors directly onto a carrier film of ceramic dielectric precursor material. The layers can then be stacked as registered sheets followed by pressing and sintering to create a unified ceramic monolithic component. In this way the overvoltage protection element is separated from the discharge electrodes by a predetermined thickness of insulating material thereby allowing the thickness and composition to be controlled through the selection of the carrier film material. The ability to control the thickness of the primary insulator layer, coupled with the ability to control the composition, allows the trigger voltage to be predictably controlled. Alternatively, an insulating layer may be applied as a liquid, or film, to form an insulating film layer such as a polyimide or other insulating, preferably polymeric, laminated layer.

The thickness of the primary insulator layer, or distance between the discharge electrodes and overvoltage protection element, represented as $T_{OVP}$ in FIGS. 3 and 4, can be much less than the typical electrode spacing in spark gap type ESD devices. Conventional spark type ESD devices have a separation between electrodes which is typically at least about 6 µm and can be in excess of 50 µm. With the inventive ESD protection device the distance between the discharge electrodes and overvoltage protection element is preferably no more than 10 µm in order to keep the trigger voltage at which the transient is diverted to <5000V based on an 8 kV pulse. A thickness of the primary insulator of about 1 µm is suitable for demonstration of the invention.

The trigger voltage is the voltage below which the capacitive couple, if present, functions as a filter capacitor and the ESD protection couple is passive. At, or above, the trigger voltage the ESD protection couple shunts the excess current to electrical ground. The trigger voltage is based on the composition and thickness of the primary insulator and the composition of the overvoltage protection element. As the thickness of the primary insulator increases the trigger voltage increases with a given primary insulator and overvoltage protection element. It would be understood by one of skill in the art that the desired trigger voltage can be obtained for a preferred primary insulator composition and overvoltage protection element by the initial preparation of multiple ESD protection devices with a series of primary insulator thicknesses, followed by testing, to determine the optimum primary insulator layer thickness. It is desirable that the trigger voltage is at least 20% higher than the working voltage of the part wherein the working voltage is a design choice for the application as well known to those of skill in the art.

By eliminating the direct contact between the discharge electrodes and overvoltage protection element the insulation resistance is several orders of magnitude higher than ESD devices made with an overvoltage protection material in direct contact with the discharge electrodes. The presence of the discrete insulator layer, as a laminate, is instrumental in maintaining low leakage current performance in the inactive mode over repeated ESD pulses. The modular, multilayer nature also provides an additional advantage in that many ESD protection couples can be stacked to form the protective element of the component thereby increasing the ability of a device to withstand multiple ESD pulses before performance is degraded.

In another embodiment of this device the discharge electrode layers shown can be alternately stacked to provide a capacitive couple within the component as described above. It should also be noted that it may be desirable to use a higher permittivity ("K") dielectric different from that used for the spark gap element capacitor between the terminals in order to add capacitance to the component dependent on the speed of signal transmission. By controlling the capacitance of the capacitive couple the ESD protection device can provide some noise suppression for slower transmission speeds.

To keep the capacitance low in the ESD protection couple it is desirable to reduce the overlap area between the overvoltage protection element and the discharge electrodes. This is because the primary insulating layer is relatively thin. Also for the same reason it is desirable for this insulating layer to have a low dielectric constant, preferably less than 100. This can be explained by applying the universal capacitance equation to the discharge electrode coupling through the primary insulator wherein:

$$C=K*K_0*A*n/t$$

where:
C=Capacitance;
K=Dielectric constant of primary insulator;
$K_0$=Permittivity of free space ($8.854 \times 10^{-12}$ F/m);
A=Overlap Area of discharge electrode and overvoltage protection element;
n=Number of layers of discharge electrode and overvoltage protection element; and
t=Thickness of primary insulator.

Therefore, at a given overlap as the primary insulator thickness decreases the capacitance increases which can be overcome by decreasing overlap area. The overlap protection element may itself contain materials such as barium titanate that have relatively high permittivity so making it desirable to minimize the overlap area.

An advantageous attribute of this inventive ESD protection device is that the properties of the materials used in the device have an outstanding ability to function at high operating temperatures and voltages. An ESD protection device can be prepared which is capable of withstanding continuous operation at a high voltage, such as 500V and a high temperature such as 200° C.

The primary insulator layer, secondary insulator and gap insulator are independently selected from those materials having a low dielectric constant and preferably each independently is, or contains, an insulating ceramic or glass. Low permittivity dielectrics are preferred and preferably the insulating ceramic has a permittivity of no more than 100, and preferably no more than 50. C0G dielectrics are particularly preferred. Particularly preferred materials for the primary insulating layer, secondary insulating layer, gap insulator and capacitor ceramic include calcium zirconate, non-stoichiometric barium titanium oxides such as $Ba_2Ti_9O_{20}$; $BaTi_4O_9$; barium rare-earth oxides containing neodymium or praseodymium, titania doped with various additives, calcium titanate, strontium titanate, zinc magnesium titanate, zirconium tin titanate and combinations thereof. As would be known to those of skill in the art the material for the primary insulating layer, secondary insulating layer, gap insulator and capacitor ceramic must be thermally compatible with the discharge electrodes to avoid degradation of the discharge electrodes during sintering of the ceramic.

The internal insulator and external insulator are not particularly limited herein as these materials can be selected based on cost and compatibility with the other materials. In one embodiment the internal insulator and external insulator are the same as at least one of the primary insulator layer, secondary insulator layer or gap insulator for manufacturing conveniences.

The overvoltage protection element comprises a conductor preferably selected from a metal and secondary material wherein the secondary material is not a conductor. The secondary material preferably comprises at least one of a ceramic, a glass or a semi-conductor. The insulating material decreases conduction and therefore minimizes leakage current in the ESD protection device. In the case where it is desirable to minimize capacitance it is desirable that the overvoltage protection element does not appreciably overlap the discharge electrodes. In some embodiments the overvoltage protection element is porous. The overvoltage protection element may include at least one of La, Ni, Co, Cu, Zn, Ru, Ag, Pd, Pt, W, Fe or Bi. Particularly preferred insulative ceramics include barium titanate or tantalum nitride. For the demonstration of this invention an overvoltage protection element consisting of 75 vol % Ni combined with 25 vol % barium titanate is suitable. The metal content must be above 50 vol % to no more than 90 vol %. Below 50 vol % the conductivity is insufficient to function as an overvoltage protection element and above 90 vol % the conductivity is too high to achieve adequate low leakage. It is preferred that the metal content be at least 70 vol % to no more than 80 vol % and the secondary material represents at least 20 vol % to 30 vol %.

The discharge electrodes and internal electrodes can be prepared from any noble metal or base metal with the preference for base metals which can be fired in air. Preferable base metals are selected from the group consisting of nickel, tungsten, molybdenum, aluminum, chromium, copper, palladium, silver or an alloy thereof. Most preferable the discharge electrodes comprise nickel.

The ESD protection device can be manufactured in a similar manner to the manufacture of multilayered ceramic capacitors, which is well documented and well known to those of skill in the art, wherein large discrete layers comprising printed patterns of the active layers are overlayed in registration followed by pressing, dicing, firing and terminating to form discrete monolithic components. In the instant application the active layers are the overvoltage protection element, discharge electrodes, internal electrodes and floating electrodes. It will be realized by those skilled in the art of MLCC manufacture that it is desirable to provide cover layers consisting of blank dielectric at the top and bottom of the device to form the external insulators described herein thereby insulating the elements of the component from the external surface. The external terminals can be plated using conventional techniques and materials and the component surface mounted.

Figure 6:
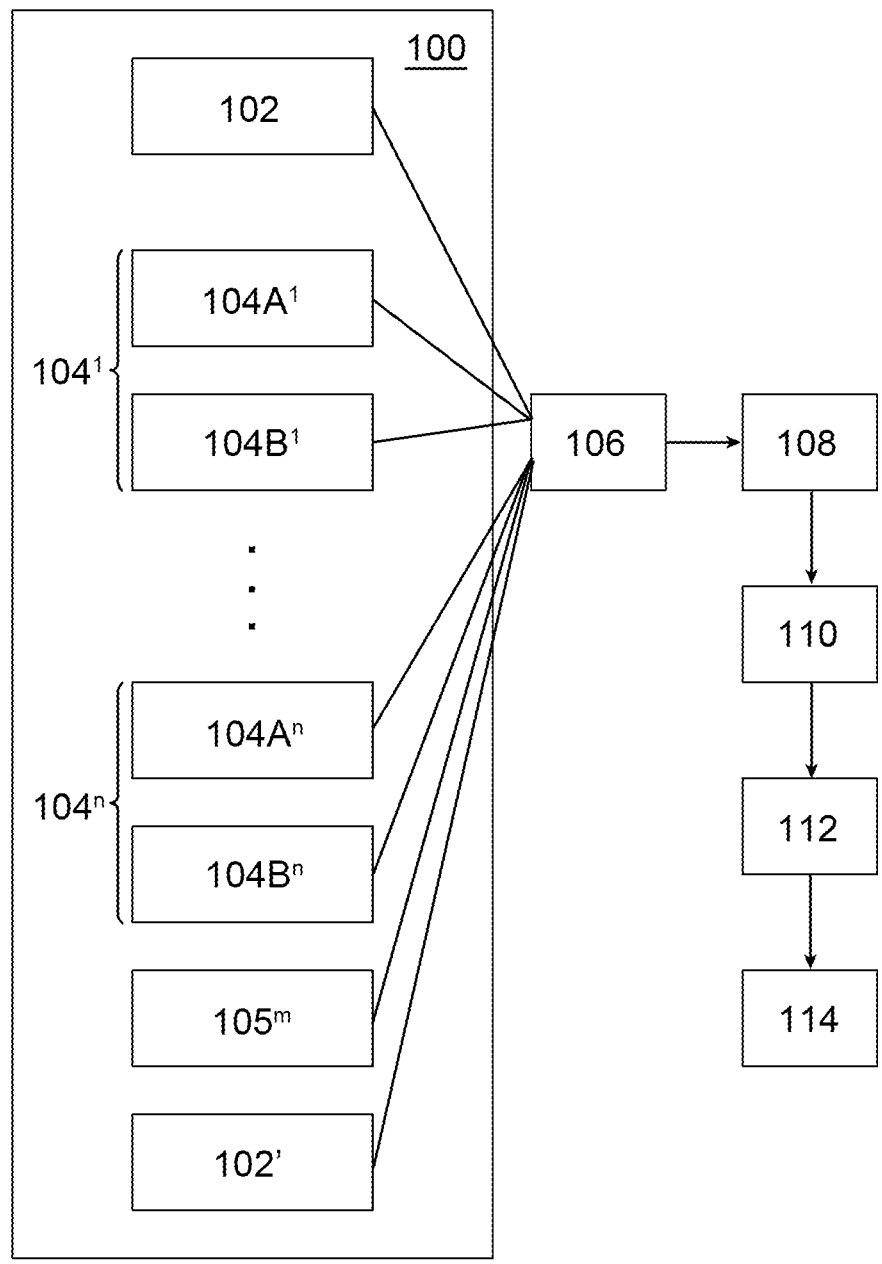
FIG. 6 is a flow-chart representation of an embodiment of the invention.

An embodiment of the invention will be described with reference to FIG. 6 wherein the process of manufacturing a ESD protection device is illustrated in flow-chart representation. In FIG. 6, a series of layers are prepared at 100. Layers 102 and 102' comprise a precursor to the external insulator and are prepared in accordance with standard manufacturing procedures for ceramic layers in MLCC capacitors as well known in the art. Layers 104 are those layers which, when 104A and 104B are taken together, form the ESD protection couples after sintering. In a preferred embodiment a layer is formed at 104A comprising an overvoltage projection element precursor and a secondary insulator precursor, as a coating, on a layer of primary insulator precursor. A layer is formed at 104B comprising the precursor to the discharge electrodes and the gap insulator on a precursor to an internal insulator. If capacitive couples are included a layer is formed at 105 comprising alternating layers of internal electrode on ceramic dielectric precursors. A floating electrode can be formed by registration of the same layers used to form the alternating layers of internal electrode and ceramic or it may include a different print pattern on a ceramic dielectric precursor as well known in the art. The layers are stacked in registration at 106 such that discharge electrodes, insulator layer precursors and overvoltage protection elements are in registration as discussed and illustrated elsewhere herein, as are the precursors to the internal electrodes, to form a registered stack. In registration the overvoltage protection element precursor will overlay the gap insulator as would be realized from FIGS. 1 and 2. The registered stack is pressed and heated at 108 to the extent necessary to bond the insulator precursors, thereby forming insulator, and to adhere adjacent layers together thereby forming a composite laminate sheet. The composite laminate sheet is diced at 110 to provide discrete ESD protection device precursors followed by thermal processing at 112. The ESD protection device precursors are finished at 114 including the addition of external terminations, overcoating if desired, to form the ESD protection device which may be tested and packaged as part of the finishing step.

EXAMPLES

A series of 0603 EIA case size ESD protection devices were produced using class I, C0G dielectric consisting primarily of calcium zirconate having a dielectric constant of about 32 as the gap insulator, primary insulator, secondary insulator, internal insulator and external insulator. The ESD protection devices were produced having varying thicknesses of primary insulator layer. The overvoltage protection elements comprised primarily nickel and barium titanate in a 3:1 volume ratio. The overvoltage protection elements were made with either 3 or 10 coplanar pairs of discharge electrodes with each coplanar pair of discharge electrodes having an overvoltage protection element separated from the discharge electrodes by the primary insulator layer. The overvoltage protection elements were co-sintered within the devices. The ESD protection devices were subjected to 8 kV ESD pulses in accordance with International Electrotechnical Commission test procedure IEC 61000-4-2 and the response to the pulses were analyzed. A typical test setup consists of a Noiseken ESS S3011/GT30R ESD simulator (150 pF 330Ω combination) and Keysight MSOS 804A high definition oscilloscope with appropriate high bandwidth attenuation. ESD protection devices with 3 and 10 pairs of nickel-based discharge electrodes using 9 μm insulation layer thicknesses were prepared and evaluated. ESD protection devices with 10 protective layers reduced the trigger voltage by approximately 20% whereas with 3 pairs of discharge electrodes leakage currents were maintained below 1 nA as shown in Table 1. Furthermore, increasing the number of ESD protection couples reduced the trigger voltage degradation over 1000 8 kV pulses from 1.7 kV to 1.3 kV.

TABLE 1

Number of electrode/OVP element pairs vs Trigger voltage, leakage current and capacitance

| Example | Secondary Material | Number of electrode/ OVP element pairs | V trigger after 10 8 kV pulses/ kV | V trigger after 1000 8 kV pulses/ kV | 1000 pulse leakage current/nA | Cap/ pF |
|---|---|---|---|---|---|---|
| 1A | Barium Titanate | 3 | 2.9 | 4.6 | 0.016 | 0.30 |
| 1B | Barium Titanate | 10 | 2.4 | 3.7 | 0.21 | 0.47 |

Figure 7:
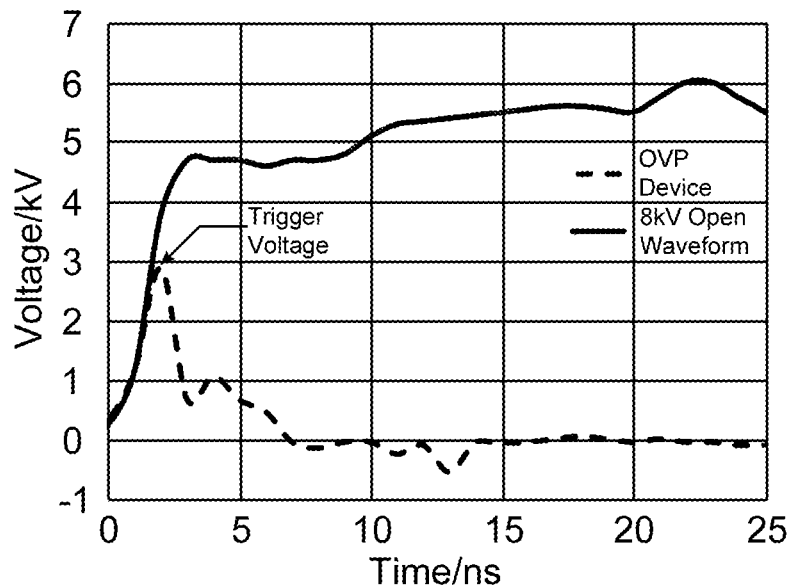
FIGS. 7 and 8 are graphical representations illustrating the advantages of the invention.
Figure 8:
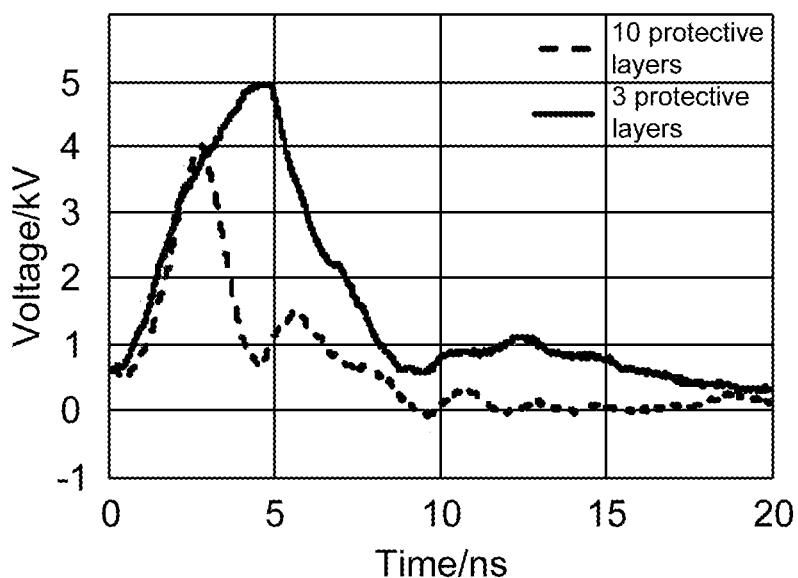

Voltage versus time for response is illustrated graphically in FIG. 7 for an 8 kV ESD pulse. In addition to reduced peak voltage, parts with additional ESD protection couples demonstrated improved durability with respect to voltage response after 1000 repeated 8 kV ESD pulses, as illustrated in FIG. 8 where the average voltage versus time after 1000 8 kV ESD pulses is reported graphically.

As discussed above, it is desirable to achieve a low trigger voltage whilst retaining stability after exposure to multiple pulses with continued low leakage. To test the effectiveness of the primary insulating layer a multiplicity of ESD protection devices were manufactured with 3 pairs of nickel discharge electrodes with differing thicknesses of the primary insulator layer.

In another example, a series of 0603 EIA case size ESD protection devices were similarly produced using class I, C0G dielectric consisting primarily of calcium zirconate having a dielectric constant of about 32 as the gap insulator, primary insulator, secondary insulator, internal insulator and external insulator. The ESD protection devices were produced having varying thicknesses of primary insulator layer. One set of ESD protection devices were produced with overvoltage protection elements comprising primarily nickel and barium titanate in a 3:1 volume ratio whilst another set of ESD protection devices were produced with overvoltage protection elements comprising primarily nickel and tantalum nitride in a 3:1 volume ratio. The overvoltage protection elements were made with 3 coplanar pairs of discharge electrodes with each coplanar pair of discharge electrodes having an overvoltage protection element separated from the discharge electrodes by the primary insulator layer. The overvoltage protection elements were co-sintered within the devices. Five ESD protection devices of each construction were subjected to 8 kV ESD pulses in accordance with International Electrotechnical Commission test procedure IEC 61000-4-2 and the response to the pulses were analyzed. A typical test setup consists of a Noiseken ESS S3011/GT30R ESD simulator (150 pF 330Ω combination) and Keysight MSOS 804A high definition oscilloscope with appropriate high bandwidth attenuation.

Figure 10:
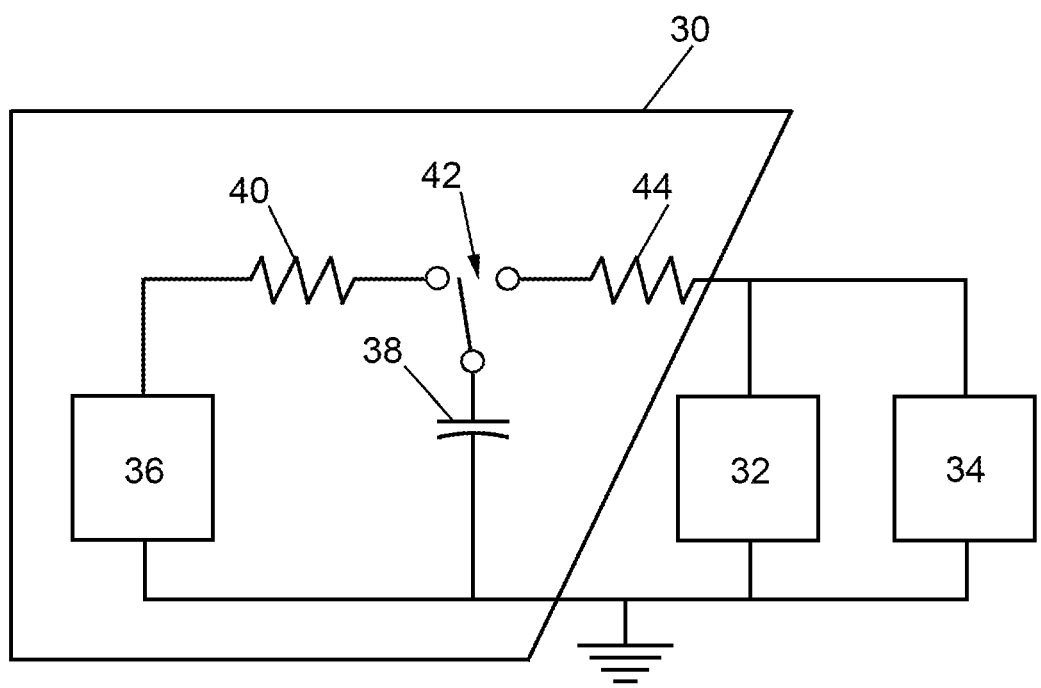

As can be seen in Table 2, increasing the thickness of the primary insulator layer reduces the leakage current after 1000 8 kV pulses. Also in Table 2, it can be seen that when tantalum nitride was used as the secondary material in the overvoltage protection element, the leakage current remained low after 1000 pulses while maintaining trigger voltage.

component, 34. In FIG. 10, a high voltage pulse generator, 36, charges a source capacitor, 38, through a charge resistor, 40, when a switch, 42, is closed for the charging cycle and open for the test pulse as illustrated. When charge is complete the switch is opened for the charging cycle and closed for the test pulse thereby allowing the capacitor to discharge through a discharge resistor, 44, thereby pulsing the ESD protection device, 32, and sensitive component, 34, which are in electrical parallel for convenience. An ESD gun typically comprises the high voltage pulse generator, 36, source capacitor, 38, charge resistor, 40, and switch, 42, as an integrated device.

To perform the test, the source capacitor in the ESD gun is charged to the test voltage and then discharged through the discharge resistor and into the test circuit. The voltage across the ESD protection device and the sensitive test component increases until the ESD protection device trigger voltage is reached, at which time the ESD protection device shunts the excess voltage to ground, thereby protecting the sensitive component from damage. If the ESD protection device voltage is higher than the voltage capability of the sensitive component, or if it is not able to shunt sufficient current to ground, the sensitive component may be damaged by the high voltage pulse.

TABLE 2

Capacitance, trigger voltage and leakage current at varying separation layer thicknesses for overvoltage protection elements consisting either of barium titanate or tantalum nitride in a 3:1 volume ratio of nickel to the secondary material in the overvoltage protection element.

| Example | Secondary Material | Ceramic separation layer thickness (μm) | Initial Capacitance (pF) | Trigger voltage 10 pulses (V) | Trigger voltage 1000 pulses (V) | Leakage current 1000 pulses @ 50 VDC (nA) |
|---|---|---|---|---|---|---|
| 2A | Barium Titanate | 0 | 0.44 | 750 | 750 | Short |
| 2B | Barium Titanate | 1 | 0.45 | 750 | 750 | Short |
| 2C | Barium Titanate | 2 | 0.54 | 931 | 905 | 12500 |
| 2D | Barium Titanate | 3 | 0.52 | 1045 | 1111 | 20 |
| 2E | Barium Titanate | 4 | 1.43 | 1264 | 1344 | 7.2 |
| 2F | Barium Titanate | 5 | 0.77 | 1564 | 1794 | 1 |
| 3A | Tantalum Nitride | 1 | 1.2 | 1066 | 1199 | 11.2 |
| 3B | Tantalum Nitride | 2 | 1.4 | 1362 | 1523 | 1.1 |
| 3C | Tantalum Nitride | 3 | 1.3 | 1530 | 1714 | 0.75 |

Figure 9:
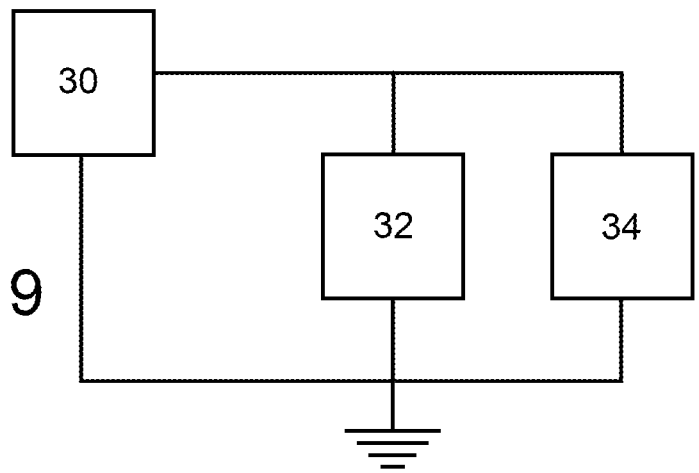
FIGS. 9 and 10 are schematic representation of circuits which demonstrate the advantages of the invention.

To determine the ability of ESD protection devices to protect sensitive electronic components, like integrated circuits (IC's), from high voltage ESD pulses, a test circuit was devised where the ESD protection device and a sensitive component were mounted in a parallel circuit configuration and subjected to ESD pulses. The ESD pulse generator used for the test was the NoiseKen ESS-S3011A, with the GT-30RA gun, arranged in a configuration to generate the ESD current pulse described in EIC 61000-4-2 specification. The ESD pulse generator had a 150 pF source capacitor, a 1 Mohm charge resistor and a 330 ohm discharge resistor. FIG. 9 is a schematic representation of the circuit arrangement.

In FIG. 9, an ESD gun, 30, provides a pulse to an ESD protection device, 32, in electrical parallel with a sensitive ESD protection devices containing an overvoltage protection element manufactured with barium titanate and another containing tantalum nitride as the secondary materials were evaluated using the test circuit shown in FIG. 9 to determine the ability of the ESD protection devices to protect sensitive components from 8 kV ESD pulses. The sensitive component selected for the test was two EIA 0603 C0G type MLCC in a serial arrangement that was shown to fail after approximately 100 ESD pulses when the ESD gun was charged to 2000V. Failure of the sensitive component was determined by measuring the insulation resistance after a series of ESD pulses. Normally, the insulation resistance of the sensitive component used is greater than 100 Gohms. A damaged capacitor was determined to be one with insulation resistance less than 100 Mohm. In addition, two commercially available ESD protection components were tested for comparison.

Table 3 contains the results of testing to demonstrate the ability of ESD protection components to protect the sensitive component from damage. Each test comprised a sample of five components. As can be seen in Table 3, ESD protection components manufactured using ceramic materials and processes described in this invention can provide superior ESD pulse protection ability compared to commercially available ESD protection components.

TABLE 3

Average pulse to failure results for various ESD protection components made with varying separation layer thicknesses and consisting of a 3:1 volume ratio of nickel to the secondary material when subjected to an 8 kV pulse.

| Example | Description | Secondary Material | Separation Layer Thickness, microns | Average Pulses to Failure |
|---|---|---|---|---|
| 4A | Ceramic ESD protection device | Barium titanate | 2 | >800 |
| 4B | Ceramic ESD protection device | Barium titanate | 3 | >600 |
| 4C | Ceramic ESD protection device | Barium titanate | 4 | 278 |
| 5A | Ceramic ESD protection device | Tantalum nitride | 1 | 840 |
| 5B | Ceramic ESD protection device | Tantalum nitride | 2 | 185 |
| 5C | Ceramic ESD protection device | Tantalum nitride | 3 | 151 |
| Comparative example 1 | ESD protection device Manufactured by Eaton p/n: 0603ESDA2 | Not known | Not applicable | 22 |
| Comparative example 2 | ESD protection device Manufactured by Littelfuse p/n: AXGD10603 | Not known | Not applicable | 102 |

The invention has been described with reference to the preferred embodiments without limit thereto. One of skill in the art would realize additional embodiments and improvements which are not specifically stated but which are within metes and bounds of the claims appended hereto.

The invention claimed is:

1. A dual-function overvoltage protection device comprising:
   at least one ESD protection couple comprising:
   a first plane comprising discharge electrodes and a gap insulator between said discharge electrodes wherein said gap insulator is within said first plane;
   a second plane comprising an overvoltage protection element parallel to said discharge electrodes; and
   a third plane comprising a primary insulator layer between said first plane and said second plane wherein said primary insulator layer is within said third plane; and
   a capacitive couple.

2. The dual-function overvoltage protection device of claim 1 wherein said overvoltage protection element comprises a conductor and a secondary material.

3. The dual-function overvoltage protection device of claim 2 wherein said overvoltage protection element has a ratio of said conductor to said secondary material of at least 50 vol % to no more than 90 vol %.

4. The dual-function overvoltage protection device of claim 2 wherein said conductor is selected from the group consisting of La, Ni, Co, Cu, Zn, Ru, Ag, Pd, Pt, W, Fe or Bi.

5. The dual-function overvoltage protection device of claim 2 wherein said secondary material is selected from the group consisting of a ceramic, a glass and a semiconductor.

6. The dual-function overvoltage protection device of claim 5 wherein ceramic is selected from the group consisting of barium titanate and tantalum nitride.

7. The dual-function overvoltage protection device of claim 1 wherein at least one of said primary insulator or said gap insulator has a permittivity of less than 100.

8. The dual-function overvoltage protection device of claim 7 wherein said permittivity is less than 50.

9. The dual-function overvoltage protection device of claim 1 wherein said primary insulator layer has a thickness of at least 1 μm to no more than 10 μm.

10. The dual-function overvoltage protection device of claim 1 wherein said primary insulator layer is selected from the group consisting of calcium zirconate, non-stoichiometric barium titanium oxide; barium rare-earth oxide; titania; calcium titanate, strontium titanate, zinc magnesium titanate, zirconium tin titanate and combinations thereof.

11. The dual-function overvoltage protection device of claim 10 wherein said non-stoichiometric barium titanium oxide is selected from the group consisting of $Ba_2Ti_9O_{20}$ or $BaTi_4O_9$.

12. The dual-function overvoltage protection device of claim 10 wherein said barium rare-earth oxide contains neodymium or praseodymium.

13. The dual-function overvoltage protection device of claim 10 wherein said titania is doped titania.

14. The dual-function overvoltage protection device of claim 1 comprising no more than 20 ESD protection couples.

15. The dual-function overvoltage protection device of claim 14 comprising 3 to 10 said ESD protection couples.

16. The dual-function overvoltage protection device of claim 1 comprising an internal secondary insulating layer between adjacent said ESD protection couples.

17. The dual-function overvoltage protection device of claim 1 wherein said discharge electrodes comprise at least one metal selected from the group consisting of nickel, tungsten, molybdenum, aluminum, chromium, copper or an alloy thereof.

18. The dual-function overvoltage protection device of claim 17 wherein said discharge electrodes comprise nickel.

19. The dual-function overvoltage protection device of claim 1 further comprising external terminations.

20. The dual-function overvoltage protection device of claim 1 wherein said capacitive couple comprises a floating electrode.

21. The dual-function overvoltage protection device of claim 1 having a trigger voltage of at least 20% higher than the working voltage of the device.

22. The dual-function overvoltage protection device of claim 1 having a capacitance of at least 100 pF to no more than 23,000 pF.

23. The dual-function overvoltage protection device of claim 22 having a capacitance of at least 1000 pF to no more than 23,000 pF.

24. The dual-function overvoltage protection device of claim 1 having a leakage current of no more than 5000 nA.

25. The dual-function overvoltage protection device of claim 24 having a leakage current of less than 1000 nA.

26. The dual-function overvoltage protection device of claim 25 having a leakage current of no more than 50 nA.

27. The dual-function overvoltage protection device of claim 26 having a leakage current of no more than 5 nA.

28. The dual-function overvoltage protection device of claim 27 having a leakage current of no more than 1 nA.

29. The dual-function overvoltage protection device of claim 1 wherein said primary insulating layer is thinner than a minimum separation distance between internal electrodes of said capacitive couple.

* * * * *